United States Patent
Mungekar et al.

(10) Patent No.: US 7,229,931 B2
(45) Date of Patent: Jun. 12, 2007

(54) OXYGEN PLASMA TREATMENT FOR ENHANCED HDP-CVD GAPFILL

(75) Inventors: Hemant P. Mungekar, San Jose, CA (US); Young S Lee, Santa Clara, CA (US); Manoj Vellaikal, Santa Clara, CA (US); Karen Greig, Santa Clara, CA (US); Bikram Kapoor, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/870,232

(22) Filed: Jun. 16, 2004

(65) Prior Publication Data

US 2005/0282398 A1     Dec. 22, 2005

(51) Int. Cl.
*H01L 21/31* (2006.01)
*H01L 21/469* (2006.01)

(52) U.S. Cl. .............. 438/758; 257/E21.546; 438/788; 438/771

(58) Field of Classification Search ........ 257/E21.546; 438/771, 788, 735, 758
See application file for complete search history.

(56) References Cited

U.S. PATENT DOCUMENTS

| | | | |
|---|---|---|---|
| 4,468,413 A | 8/1984 | Bachmann | |
| 4,572,841 A | 2/1986 | Kaganowicz et al. | |
| 4,690,746 A | 9/1987 | McInerney et al. | |
| 4,737,379 A | 4/1988 | Hudgens et al. | |
| 4,835,005 A | 5/1989 | Hirooka et al. | |
| 4,851,370 A | 7/1989 | Doklan et al. | |
| 4,872,947 A | 10/1989 | Wang et al. | |
| 4,890,575 A | 1/1990 | Ito et al. | |
| 4,892,753 A | 1/1990 | Wang et al. | |
| 4,894,352 A | 1/1990 | Lane et al. | |

(Continued)

FOREIGN PATENT DOCUMENTS

EP     0 496 543 A2     7/1992

(Continued)

OTHER PUBLICATIONS

Abraham, "Reactive Facet Tapering of Plasma Oxide For Multilevel Interconnect Applications," VMIC Conference. pp. 115-121 (1987).

(Continued)

*Primary Examiner*—Caridad Everhart
(74) *Attorney, Agent, or Firm*—Townsend and Townsend and Crew LLP

(57) ABSTRACT

Methods are provided for depositing a silicon oxide film on a substrate disposed in a substrate processing chamber. The substrate has a gap formed between adjacent raised surfaces. A process gas having a silicon-containing gas, an oxygen-containing gas, and a fluent gas is flowed into the substrate processing chamber. The fluent gas is introduced into the substrate processing chamber at a flow rate of at least 500 sccm. A plasma is formed having an ion density of at least $10^{11}$ ions/cm$^3$ from the process gas to deposit a first portion of the silicon oxide film over the substrate and into the gap. Thereafter, the deposited first portion is exposed to an oxygen plasma having at least $10^{11}$ ions/cm$^3$. Thereafter, a second portion of the silicon oxide film is deposited over the substrate and into the gap.

20 Claims, 8 Drawing Sheets

U.S. PATENT DOCUMENTS

| | | | |
|---|---|---|---|
| 4,960,488 A | 10/1990 | Law et al. | |
| 5,000,113 A | 3/1991 | Wang et al. | |
| 5,013,691 A | 5/1991 | Lory et al. | |
| 5,089,442 A | 2/1992 | Olmer | |
| 5,124,014 A * | 6/1992 | Foo et al. | 438/694 |
| 5,156,881 A | 10/1992 | Okano et al. | |
| 5,215,787 A | 6/1993 | Homma | |
| 5,271,972 A | 12/1993 | Kwok et al. | |
| 5,275,977 A | 1/1994 | Otsubo et al. | |
| 5,279,865 A | 1/1994 | Chebi et al. | |
| 5,288,518 A | 2/1994 | Homma | |
| 5,302,233 A | 4/1994 | Kim et al. | |
| 5,314,724 A | 5/1994 | Tsukune et al. | |
| 5,319,247 A | 6/1994 | Matsuura | |
| 5,334,552 A | 8/1994 | Homma | |
| 5,362,526 A | 11/1994 | Wang et al. | |
| 5,385,763 A | 1/1995 | Okano et al. | |
| 5,399,529 A | 3/1995 | Homma | |
| 5,413,967 A | 5/1995 | Matsuda et al. | |
| 5,416,048 A | 5/1995 | Blalock et al. | |
| 5,420,075 A | 5/1995 | Homma et al. | |
| 5,429,995 A | 7/1995 | Nishiyama et al. | |
| 5,468,342 A | 11/1995 | Nulty et al. | |
| 5,474,589 A | 12/1995 | Ohga et al. | |
| 5,507,881 A | 4/1996 | Sichanugrist et al. | |
| 5,525,550 A | 6/1996 | Kato | |
| 5,563,105 A | 10/1996 | Dobuzinsky et al. | |
| 5,571,576 A | 11/1996 | Qian et al. | |
| 5,589,233 A | 12/1996 | Law et al. | |
| 5,593,741 A | 1/1997 | Ikeda | |
| 5,599,740 A | 2/1997 | Jang et al. | |
| 5,614,055 A | 3/1997 | Fairbairn et al. | |
| 5,621,241 A | 4/1997 | Jain | |
| 5,624,582 A | 4/1997 | Cain | |
| 5,629,043 A | 5/1997 | Inaba et al. | |
| 5,645,645 A | 7/1997 | Zhang et al. | |
| 5,648,175 A | 7/1997 | Russell et al. | |
| 5,661,093 A | 8/1997 | Ravi et al. | |
| 5,679,606 A * | 10/1997 | Wang et al. | 438/763 |
| 5,712,185 A | 1/1998 | Tsai et al. | |
| 5,719,085 A | 2/1998 | Moon et al. | |
| 5,776,557 A | 7/1998 | Okano et al. | |
| 5,776,834 A * | 7/1998 | Avanzino et al. | 438/692 |
| 5,786,039 A | 7/1998 | Brouquet | |
| 5,804,259 A | 9/1998 | Robles | |
| 5,807,785 A | 9/1998 | Ravi | |
| 5,849,455 A | 12/1998 | Ueda et al. | |
| 5,850,105 A | 12/1998 | Dawson et al. | |
| 5,858,876 A | 1/1999 | Chew | |
| 5,869,149 A | 2/1999 | Denison et al. | |
| 5,872,052 A | 2/1999 | Iyer | |
| 5,872,058 A * | 2/1999 | Van Cleemput et al. | 438/692 |
| 5,874,350 A | 2/1999 | Nakagawa | |
| 5,903,106 A | 5/1999 | Young et al. | |
| 5,910,342 A | 6/1999 | Hirooka et al. | |
| 5,913,140 A | 6/1999 | Roche et al. | |
| 5,915,190 A | 6/1999 | Pirkle | |
| 5,937,323 A | 8/1999 | Orczyk et al. | |
| 5,939,831 A | 8/1999 | Fong et al. | |
| 5,944,902 A | 8/1999 | Redeker et al. | |
| 5,953,635 A | 9/1999 | Andideh | |
| 5,968,610 A | 10/1999 | Liu et al. | |
| 5,976,327 A | 11/1999 | Tanaka | |
| 5,990,000 A | 11/1999 | Hong et al. | |
| 5,990,013 A | 11/1999 | Berenguer et al. | |
| 6,013,191 A | 1/2000 | Nasser-Faili et al. | |
| 6,013,584 A | 1/2000 | M'Saad | |
| 6,030,666 A | 2/2000 | Lam et al. | |
| 6,030,881 A * | 2/2000 | Papasouliotis et al. | 438/424 |
| 6,037,018 A | 3/2000 | Jang et al. | |
| 6,039,851 A | 3/2000 | Iyer | |
| 6,042,901 A | 3/2000 | Denison et al. | |
| 6,059,643 A | 5/2000 | Hu et al. | |
| 6,070,551 A | 6/2000 | Li et al. | |
| 6,071,573 A | 6/2000 | Koemtzopoulos et al. | |
| 6,074,959 A | 6/2000 | Wang et al. | |
| 6,077,786 A | 6/2000 | Chakravarti et al. | |
| 6,096,646 A | 8/2000 | Lee et al. | |
| 6,106,678 A | 8/2000 | Shufflebotham et al. | |
| 6,136,685 A | 10/2000 | Narwankar et al. | |
| 6,147,009 A | 11/2000 | Grill et al. | |
| 6,149,976 A | 11/2000 | Matsuki et al. | |
| 6,149,986 A | 11/2000 | Shibata et al. | |
| 6,167,834 B1 | 1/2001 | Wang et al. | |
| 6,170,428 B1 | 1/2001 | Redeker et al. | |
| 6,174,808 B1 | 1/2001 | Jang et al. | |
| 6,182,602 B1 | 2/2001 | Redeker et al. | |
| 6,184,158 B1 | 2/2001 | Shufflebotham et al. | |
| 6,189,483 B1 | 2/2001 | Ishikawa et al. | |
| 6,190,233 B1 | 2/2001 | Hong et al. | |
| 6,191,026 B1 | 2/2001 | Rana et al. | |
| 6,194,037 B1 | 2/2001 | Terasaki et al. | |
| 6,194,038 B1 | 2/2001 | Rossman | |
| 6,197,705 B1 | 3/2001 | Vassiliev | |
| 6,200,412 B1 | 3/2001 | Kilgore et al. | |
| 6,203,863 B1 | 3/2001 | Liu et al. | |
| 6,217,658 B1 | 4/2001 | Orczyk et al. | |
| 6,224,950 B1 | 5/2001 | Hirata | |
| 6,228,751 B1 | 5/2001 | Yamazaki et al. | |
| 6,230,650 B1 | 5/2001 | Yamazaki | |
| 6,232,196 B1 | 5/2001 | Raaijmakers et al. | |
| 6,313,010 B1 | 11/2001 | Nag et al. | |
| 6,326,064 B1 | 12/2001 | Denison et al. | |
| 6,335,288 B1 | 1/2002 | Kwan et al. | |
| 6,346,302 B2 | 2/2002 | Kishimoto et al. | |
| 6,372,291 B1 | 4/2002 | Hua et al. | |
| 6,395,150 B1 | 5/2002 | Van Cleemput et al. | |
| 6,416,823 B2 | 7/2002 | Li et al. | |
| 6,465,044 B1 | 10/2002 | Jain et al. | |
| 6,503,843 B1 | 1/2003 | Xia et al. | |
| 6,531,193 B2 | 3/2003 | Fonash et al. | |
| 6,537,929 B1 | 3/2003 | Cheung et al. | |
| 6,559,026 B1 | 5/2003 | Rossman et al. | |
| 6,589,610 B2 | 7/2003 | Li et al. | |
| 6,589,611 B1 | 7/2003 | Li et al. | |
| 6,596,653 B2 | 7/2003 | Tan et al. | |
| 6,596,654 B1 | 7/2003 | Bayman et al. | |
| 6,607,983 B1 | 8/2003 | Chun et al. | |
| 6,626,188 B2 | 9/2003 | Fitzsimmons et al. | |
| 6,653,203 B1 | 11/2003 | Huang et al. | |
| 6,673,722 B1 | 1/2004 | Yamazaki | |
| 6,713,390 B2 | 3/2004 | M'Saad et al. | |
| 7,067,440 B1 * | 6/2006 | Bayman et al. | 438/788 |
| 2001/0028924 A1 | 10/2001 | Sherman | |
| 2001/0033900 A1 | 10/2001 | M'Saad et al. | |
| 2002/0187655 A1 | 12/2002 | Tan | |
| 2002/0192396 A1 | 12/2002 | Wang et al. | |
| 2003/0056900 A1 | 3/2003 | Li et al. | |
| 2003/0087506 A1 * | 5/2003 | Kirchhoff | 438/424 |
| 2003/0127422 A1 * | 7/2003 | Tsuchiya | 216/2 |
| 2003/0159656 A1 | 8/2003 | Tan et al. | |
| 2003/0203637 A1 | 10/2003 | Hua et al. | |
| 2003/0207580 A1 | 11/2003 | Li et al. | |
| 2003/0219540 A1 | 11/2003 | Law et al. | |
| 2004/0146661 A1 | 7/2004 | Kapoor et al. | |

FOREIGN PATENT DOCUMENTS

| | | |
|---|---|---|
| EP | 0 883 166 A2 | 9/1998 |
| GB | 2 267 291 | 12/1993 |
| JP | 61-276977 A | 12/1986 |
| JP | 2058836 A | 2/1990 |
| JP | 4-341568 | 11/1992 |
| JP | 7-161703 A | 6/1995 |

WO    WO 92/20833 A1    11/1992

OTHER PUBLICATIONS

Alonso, J.C. et al., "High rate-low temperature deposition of silicon dioxide films . . . " JVST A 13(6) Nov./Dec. 1995, pp. 2924-2929.
Bar-Ilan et al., "A comparative study of sub-micron gap filling and planarization techniques", SPIE vol. 2636, Oct. 1995, . 277-288.
Broomfield et al., "HDP Dielectric Beol Gapfill: A Process for Manufacturing", IEEE/SEMI Advanced Semiconductor Manufacturing Conference 1996, pp. 255-258.
Chang et al. "Frequency Effects and Properties of Plasma Deposited Fluorinated Silicon Nitride", American Vacuum Society. 1988. pp. 524-532.
Conti et al., "Processing methods to fill High aspect ratio gaps without premature constriction," DUMIC Conference, Feb. 8-9, 1999, pp. 201-209.
Fukada et al. "Preparation of SiOF Films with Low Dielectric Constant By ECR Plasma CVD", Japan. DUMIC Conference. Feb. 1995. pp. 43-49.
Galiano et al. "Stress-Temperature Behavior of Oxide Films Used for Intermetal Dielectric Applications", VMIC Conference. Jun. 1992. pp. 100-106.
Horiike et al., "High rate and highly selective SiO2 etching employing inductively coupled plasma and discussion on reaction kinetics", JVST A 13(3) May/Jun. 1995, pp. 801-809.
Kuo et al., "Thick SiO2 films obtained by plasma-enhanced chemical vapor deposition using hexamethyldisilazane, Carbon dioxide and hydrogen", Journal of The Electrochemical Society, 147 (7) 2000 p. 2679-2684.
Laxman, "Low e Dielectrics: CVD Fluorinated Silicon Dioxides", Semiconductor International. May 1995. pp. 71-74.
Lee et al., "Dielectric Planarization Techniques For Narrow Pitch Multilevel Interconnects," VMIC Conference, pp. 85-92 (1987).
Lee et al., "Low Temperature Silicon Nitride and silicon Dioxide Film . . . " JECS: 147 (4) 2000, pp. 1481-1486.
Lim et al., "Gap-fill Performance and Film properties of PMD Films for the 65 nm device Technology", IEEE International Symposium on Semiconductor Manufacturing, Sep. 30-Oct. 2, 2003, p. 435-438.
Matsuda et al. "Dual Frequency Plasma CVD Fluorosilicate Glass: Deposition for 0.25 um Interlevel Dielectrics", DUMIC Conference. Feb. 1995. pp. 22-28.
Meeks et al., "Modeling of SiO 2 deposition in high density plasma reactors and comparisons of model predictions with experimental measurements," J. Vac. Sci. Technol. A, 16(2):544-563 (1998).
Musaka, "Single Step Gap Filling Technology fo Subhalf Micron Metal Spacings on Plasma Enhanced TEOS/O2 Chemical Vapor Depostion System," International Conference on Solid State Devices and Materials pp. 510-512, held in Japan, (1993).
Nag et al., "Comparative Evaluation of gap- fill dielectrics in shallow trench isolation for sub-0.25 micron Technologies" IEDM 1996, . 841-844.
Nalwa, H.S., *Handbook of Low and High Dielectric Constant Materials and Their Applications*, vol. 1, p. 66 (1999).

Nguyen, s.v., "High-Density Plasma Chemical Vapor Deposition of Silicon-Based Dielectric Films for Integrated Circuits," Journal of Research and Development, vol. 43, 1/2 (1999).
Pai, "High quality voids free oxide deposition", Materials Chemistry and Physics, 44, 1996, pp. 1-8.
Pankov et al., "The effect of hydrogen addition on the fluorine doping level of SiO2 films prepared by remote plasma enhanced chemical vapor deposition using SiF4-based plasmas", Japanese Journal of Applied Physics part 1,37 (11) Nov. 1998, pp. 6135-6141.
Peters, "Choices and challenges for shallow trench isolation", Semiconductor International, Apr. 1999, pp. 69-76.
Qian et al., "High Density Plasma Deposition and Deep Submicron Gap Fill with Low Dielectric Constant SiO2 Films," DUMIC Conference, Feb. 21-22, 1995, pp. 50-56, held in California.
Robles et al. "Effects of RF Frequency and Deposition Rates on the Moisture Resistance of PECVD TEOS-Based Oxide Films", ECS Extended Abstracts. vol. 92-1. May 1992. pp. 215-216.
Shapiro et al. "Dual Frequency Plasma CVD Fluorosilicate Glass: Water Absorption And Stability", DUMIC Conference. Feb. 1995. pp. 118-123.
Takahashi et al., "The Effect of Gas-phase additives C2H4, C2H6 and C2H2 on SiH4/O2 chemical vapor deposition". Journal of the Electrochemical Society, 143 (4) Apr. 1996, pp. 1355-1361.
Takeishi et al., "Fluorocarbon films deposited by PECVD with . . . " DUMIC 1996, pp. 71-77.
Usami et al. "Low Dielectric Constant Interlayer Using Fluorine-Doped Silicon Oxide", Jpn. J. Appl. Phys. vol. 33, Jan. 1994. pp. 408-412.
Vassiliev et al., "Trends in void-free pre-metal CVD dielectrics," Solid State Technology, Mar. 2001, pp. 129-136, www.solid-state.com.
Vassiliev et al., "Properties and Gap-Fill Capability of HPD-CVD Phosphosilicate Glass Films for Subquarter-Micrometer ULSI Device Technology" Electrochemical and Solid-State Letters 3 (2), 2000, pp. 80-83.
Vassiliev, "Void-free pre-metal dielectric gap- fill capability with CVD films for subquarter-micron ULSI" DUMIC, Feb. 28-29, 2000, pp. 121-132.
Xia et al., "High aspect ratio trench filling sing two-step . . . " JECS, 146 (5),1999, p. 1884-1888.
Xia et al., "High Temperature Subatmospheric Chemical Vapor Deposited Undoped Silicate Glass," JECS 146 (3) 1999, pp. 1181-1185.
Yota et al., "Advanced passivation layer using high-density plasma CVD oxide for 0.25 micron CMOS Technology" DUMIC, Feb. 16-17, 1998,pp. 185-192.
Yota et al., "Extendibility of ICP high-density plasma CVD for use as intermetal dielectric and passivation layers for 0.18 micron technology," DUMIC Feb. 8-9, 1999, pp. 71-82.
Yu et al. "Step Coverage Study of Peteos Deposition for Intermetal Dielectric Applications", VMIC Conference. Jun. 1990. pp. 166-172.

\* cited by examiner

OXYGEN PLASMA TREATMENT FOR ENHANCED HDP-CVD GAPFILL

BACKGROUND OF THE INVENTION

One common step that may be performed frequently during fabrication of modern semiconductor devices is the formation of a film, such as a silicon oxide film, on a semiconductor substrate. Silicon oxide is widely used as an insulating film in the manufacture of semiconductor devices and, as is well known, may be deposited as a film by a thermal chemical vapor deposition ("CVD") process or by a plasma-enhanced CVD ("PECVD") process. In conventional thermal CVD processes, reactive gases are supplied to the substrate surface, where heat-induced chemical reactions take place to form the desired film. In a conventional plasma process, a controlled plasma is formed to decompose and/or energize reactive species to produce the desired film.

Semiconductor-device geometries have decreased significantly in size since such devices were originally developed several decades ago. This decrease in device-geometry size has consequently resulted in an increase of circuit elements and interconnections formed in integrated circuits fabricated on semiconductor substrates. One persistent challenge faced by semiconductor manufacturers in the design and fabrication of such densely packed integrated circuits is the prevention of spurious interactions between circuit elements.

Unwanted interactions are typically prevented by providing spaces, sometimes referred to in the art as "gaps" or "trenches," between adjacent elements, and filling the spaces with electrically insulative material. This arrangement acts to isolate the elements both physically and electrically. Such spaces may be used in a variety of different applications, including shallow-trench-isolation ("STI"), premetal-dielectric ("PMD"), or intermetal-dielectric ("IMD") applications, among others. As circuit densities increase with reduced feature sizes, the widths of these spaces decrease, increasing their aspect ratios, which are defined as respective ratios of a gap's depth to its width. High-aspect-ratio gaps are difficult to fill using conventional CVD methods, causing some integrated-circuit manufacturers to turn to the use high-density-plasma CVD ("HDP-CVD") techniques. The use of an HDP-CVD technique results in the formation of a plasma that has a density approximately two orders of magnitude greater than the density of a conventional, capacitively coupled plasma. Examples of HDP-CVD systems include inductively coupled plasma ("ICP") systems and electron-cyclotron-resonance ("ECR") systems, among others. There are a number of advantages of plasma-deposition processes in gapfill applications that are thus enhanced in the case of HDP-CVD deposition processes. For example, the high reactivity of the species in any plasma deposition process reduces the energy required for a chemical reaction to take place, thereby allowing the temperature of the process to be reduced compared with conventional thermal CVD processes; the temperatures of HDP-CVD processes may advantageously be even lower than with PECVD processes because the species reactivity is even higher. Similarly, HDP-CVD systems generally operate at lower pressure ranges than low-density plasma systems. The low chamber pressure provides active species having a long mean-free-path and reduced angular distribution. These factors contribute to a significant number of constituents from the plasma reaching even the deepest portions of closely spaced gaps, providing a film with improved gapfill capabilities.

Another factor that allows films deposited by HDP-CVD techniques to have improved gapfill characteristics is the occurrence of sputtering, promoted by the plasma's high density, simultaneous with film deposition. The sputtering component of HDP deposition slows deposition on certain features, such as the corners of raised surfaces, thereby contributing to the increased gapfill ability of HDP deposited films. Some HDP-CVD processes introduce an inert element that further promotes the sputtering effect, with the choice of inert element often depending on its atomic or molecular weight, a parameter that is generally correlated with the size of the sputtering effect. In addition, the sputtering effect may be further promoted by applying an electric bias with an electrode in the substrate support pedestal to use electrical attraction of the plasma species.

It was initially thought that the simultaneous deposition and etching provided by HDP-CVD processes would allow gaps to be filled in almost any application. Semiconductor manufacturers have discovered, however, that there is a practical limit to the aspect ratio of gaps that HDP-CVD deposition techniques are able to fill. The challenge of filling gaps with HDP-CVD is illustrated schematically with the cross-sectional views shown in FIGS. 1A and 1B. FIG. 1A shows a vertical cross section of a substrate 110, such as may be provided with a semiconductor wafer, having a film of features 120. Adjacent features 120 define gaps 114 that are to be filled with dielectric material, with the sidewalls 116 of the gaps being defined by the surfaces of the features 120. As the deposition proceeds, dielectric material 118 accumulates on the surfaces of the features 120, as well as on the substrate 110, and forms overhangs 122 at the corners 124 of the features 120. As deposition of the dielectric material 118 continues, the overhangs 122 typically grow faster than the gap 114 in a characteristic breadloafing fashion. Eventually, the overhangs 122 grow together to form the dielectric film 126 shown in FIG. 1B, preventing deposition into an interior void 128.

In an increasingly common process, an HDP-CVD process is used to deposit a silicon oxide film using a process gas that includes monosilane $SiH_4$, molecular oxygen $O_2$, and argon Ar. It has been reported that when such a process is used to fill certain narrow-width, high-aspect-ratio gaps, the sputtering caused by argon in the process gas hampers the gapfill effects. Specifically, it has been reported that material sputtered by argon in the process redeposits on the upper portions of the sidewalls of the gaps being filled at a rate faster than at the lower portions. This, in turn, has resulted in the formation of a void in the gap as illustrated in FIG. 1B. There accordingly remains a need in the art for techniques that allow improved gapfill with HDP-CVD processes.

BRIEF SUMMARY OF THE INVENTION

Embodiments of the invention thus provide methods for depositing a silicon oxide film within a gap. The methods use an HDP-CVD deposition process having a high flow of a fluent gas. The deposition is interrupted one or more times to provide an oxygen plasma treatment to a portion of the deposited film.

For example, in a first set of embodiments, a method is provided for depositing a silicon oxide film on a substrate disposed in a substrate processing chamber. The substrate has a gap formed between adjacent raised surfaces. A process gas comprising a silicon-containing gas, an oxygen-containing gas, and a fluent gas is flowed into the substrate processing chamber. The fluent gas is introduced into the substrate processing chamber at a flow rate of at least 500 sccm. A plasma is formed having an ion density of at least $10^{11}$ ions/cm$^3$ from the process gas to deposit a first portion of the silicon oxide film over the substrate and into the gap. Thereafter, the deposited first portion is exposed to a plasma having at least $10^{11}$ ions/cm$^3$ and consisting essentially of oxygen ions. Thereafter, a second portion of the silicon oxide film is deposited over the substrate and into the gap.

In some such embodiments, the process gas may be formed by flowing the oxygen-containing gas with a flow rate less than 2.5 times a flow rate of the silicon-containing gas. In some instances, the deposited second portion may also be exposed to a plasma having at least $10^{11}$ ions/cm$^3$ and consisting essentially of oxygen ions so that, thereafter, a third portion of the silicon oxide film is deposited over the substrate and into the gap. For example, the exposing the deposited first portion may be performed when more than 20% of an original height of the gap is filled and/or exposing the deposited second portion may be performed when more than 60% of the original height of the gap is filled. The deposited first portion may be exposed to the oxygen plasma for at least 10 seconds. In one embodiment, the fluent gas comprises $H_2$, which may be provided to the process chamber with a flow rate of at least 800 sccm. The deposited first portion may be exposed to the oxygen plasma by terminating a flow of the silicon-containing gas and a flow of the fluent gas without extinguishing the plasma. Similarly, the second portion may be deposited by restarting the flow of the silicon-containing gas and the flow of the fluent gas without extinguishing the plasma.

In a second set of embodiments, a method is also provided for depositing a silicon oxide film on a substrate disposed in a substrate processing chamber. The substrate has a gap formed between adjacent raised surfaces. A first portion of the silicon oxide film is deposited over the substrate and within the gap by forming a first high-density plasma that provides simultaneous deposition and sputtering components from a first process gas; the first process gas comprises a silicon source, an oxygen source, and a fluent gas. Thereafter, the deposited first portion is exposed to a plasma consisting essentially of oxygen ions. Thereafter, a second portion of the silicon oxide film is deposited over the substrate and within the gap by forming a high-density plasma that provides simultaneous deposition and sputtering components from a second process gas; the second process gas comprises a silicon source, an oxygen source, and a fluent gas. Thereafter, the second portion is exposed to a plasma consisting essentially of oxygen atoms. Thereafter, a third portion of the silicon oxide film is deposited over the substrate and into the gap.

The deposited first portion may be exposed to the oxygen plasma when more than 20% of an original height of the gap is filled and/or the deposited second portion may be exposed to the oxygen plasma when more than 60% of the original height of the gap is filled. In one embodiment, the fluent gas comprises $H_2$ and has a flow rate of at least 800 sccm. In another embodiment, the first and second portions of the film are deposited by providing the oxygen source to the process chamber with a flow rate less than 2.5 times a flow rate for providing the silicon source to the process chamber. In some instances, exposing the deposited first portion, depositing the second portion, exposing the deposited second portion, and depositing the third portion are all performed without extinguishing the plasma.

In a third set of embodiments, a method is also provided for depositing a silicon oxide film on a substrate disposed in a substrate processing chamber. The substrate has a gap formed between adjacent raised surfaces. A first portion of the silicon oxide film is deposited over the substrate and within the gap by forming a high-density plasma that provides simultaneous deposition and sputtering components from a first process gas. The first process gas comprises $SiH_4$, $O_2$, and $H_2$, and the $H_2$ is introduced into the substrate processing chamber with a flow rate at least ten times greater than a flow rate of the $O_2$. Thereafter, the deposited first portion is exposed to a high-density plasma consisting essentially of oxygen ions for at least 10 seconds. Thereafter, a second portion of the silicon oxide film is deposited over the substrate and into the gap.

In some such embodiments, the first portion may be deposited by flowing the $O_2$ into the process chamber with a flow rate less than 2.5 times a flow rate of the $SiH_4$. Exposing the first deposited portion to the oxygen plasma may comprise terminating a flow of the $SiH_4$ and the $H_2$ to the substrate processing chamber without extinguishing the plasma. In such instances, depositing the second portion of the silicon oxide film may comprise forming a high-density plasma that provides simultaneous deposition and sputtering components from a second process gas; the second process gas comprises $SiH_4$, $O_2$, and $H_2$, with the $H_2$ introduced into the substrate processing chamber with a flow rate at least ten times greater than a flow rate of the $O_2$. For instance, in one embodiment, depositing the second portion of the silicon oxide film comprises restarting the flow of the $SiH_4$ and the $H_2$. In some instances, the deposited second portion of the film may be exposed to a high-density plasma consisting essentially of oxygen ions for at least 10 seconds, and a third portion of the silicon oxide film deposited over the substrate and into the gap thereafter.

A further understanding of the nature and advantages of the present invention may be realized by reference to the remaining portions of the specification and the drawings.

DETAILED DESCRIPTION OF THE INVENTION

Figure 1A:
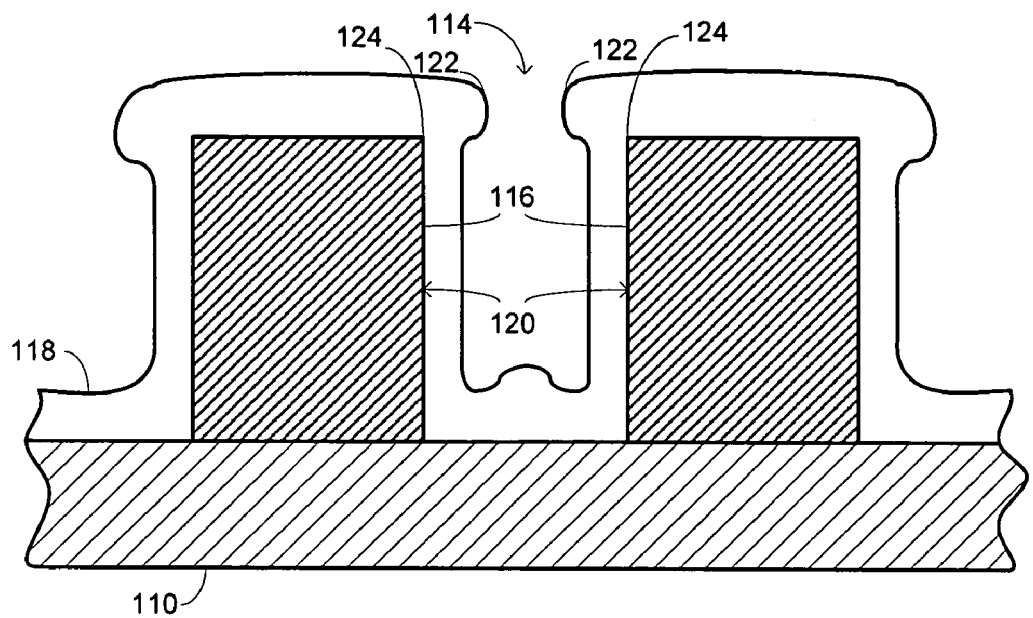
FIGS. 1A and 1B are schematic cross-sectional drawings illustrating the formation of a void during a gapfill process.
Figure 1B:
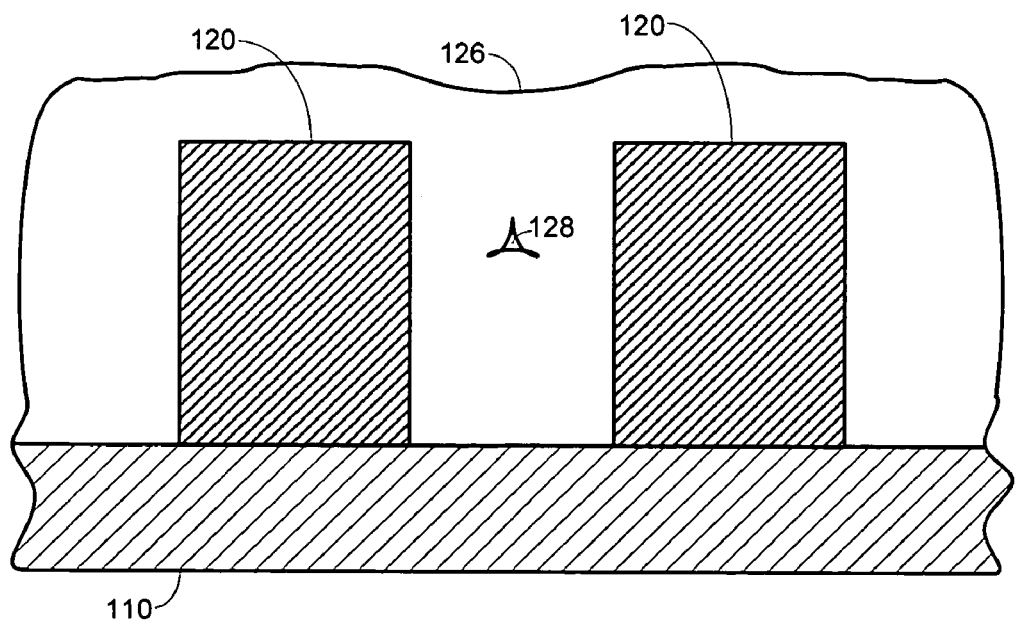

Embodiments of the invention are directed towards methods of depositing a silicon oxide film to fill a gap in a surface of a substrate using an HDP-CVD process. Silicon oxide films deposited according to the techniques described herein have excellent gapfill capabilities and are able to fill high-aspect-ratio gaps encountered in, for example, shallowtrench-isolation structures. In addition, the methods described herein result in films having good composition uniformity. Films deposited by the methods of the invention are thus suitable for use in the fabrication of a variety of integrated circuits, and are particularly useful in the fabrication of integrated circuits having minimum feature sizes of 0.13 microns or less.

As used herein, references to an HDP-CVD process are intended to refer to a plasma CVD process that includes simultaneous deposition and sputtering components, and that employs a plasma having an ion density on the order of $10^{11}$ ions/cm$^3$ or greater. The relative levels of the combined deposition and sputtering characteristics of the high-density plasma may depend on factors such as the flow rates of various gases included in the gaseous mixture from which the plasma is formed, as well as the source and bias power levels applied to maintain the plasma and bias the plasma towards the substrate, respectively.

In depositing a silicon oxide film, embodiments of the invention provide flows of a process gas to a substrate processing chamber, with the process gas including a silicon source in the form of a silicon-containing gas and an oxygen source in the form of an oxygen-containing gas; one example of the silicon-containing gas is monosilane $SiH_4$ and one example of the oxygen-containing gas is $O_2$, although other precursor gases may be used in other embodiments. In addition, the process gas includes a flow of a fluent gas, which may comprise an inert gas such as Ar, Ne, or He, or may comprise another fluent gas such as molecular hydrogen $H_2$; in some instances, the fluent gas may comprise a mixture of gases, such as a He/$H_2$ mixture in some embodiments. The flow of the fluent gas is provided to the substrate processing chamber is provided with a high flow rate, which is intended to refer herein to flows of at least 500 sccm and/or flows that are at least ten times a flow rate of the oxygen source. In some instances, the process gas may additionally include a dopant precursor gas, such as a flow of $SiF_4$ to fluorinate the film, a flow of $PH_3$ to phosphorate the film, a flow of $B_2H_6$ to boronate the film, a flow of $N_2$ to nitrogenate the film, and the like.

At least for some fluent gases, the high flow rates improve the gapfill capability of the deposition process. In particular, the inventors were considering gapfill capabilities of deposition processes that use molecular hydrogen $H_2$ as the fluent gas. The relatively low molecular weight of $H_2$ significantly limits the sputtering component of the HDP-CVD deposition process, a factor that has been found to be beneficial in certain aggressive gapfill applications. In addition, the relatively high flow rate of $H_2$ in such processes has additionally been found to be beneficial in further improving the gapfill characteristics in such applications. The inventors believe that the benefit of a high flow rate of $H_2$ is results specifically from the ratio of the flow rate of $H_2$ to the flow rate of the oxygen source being high.

Figure 2:
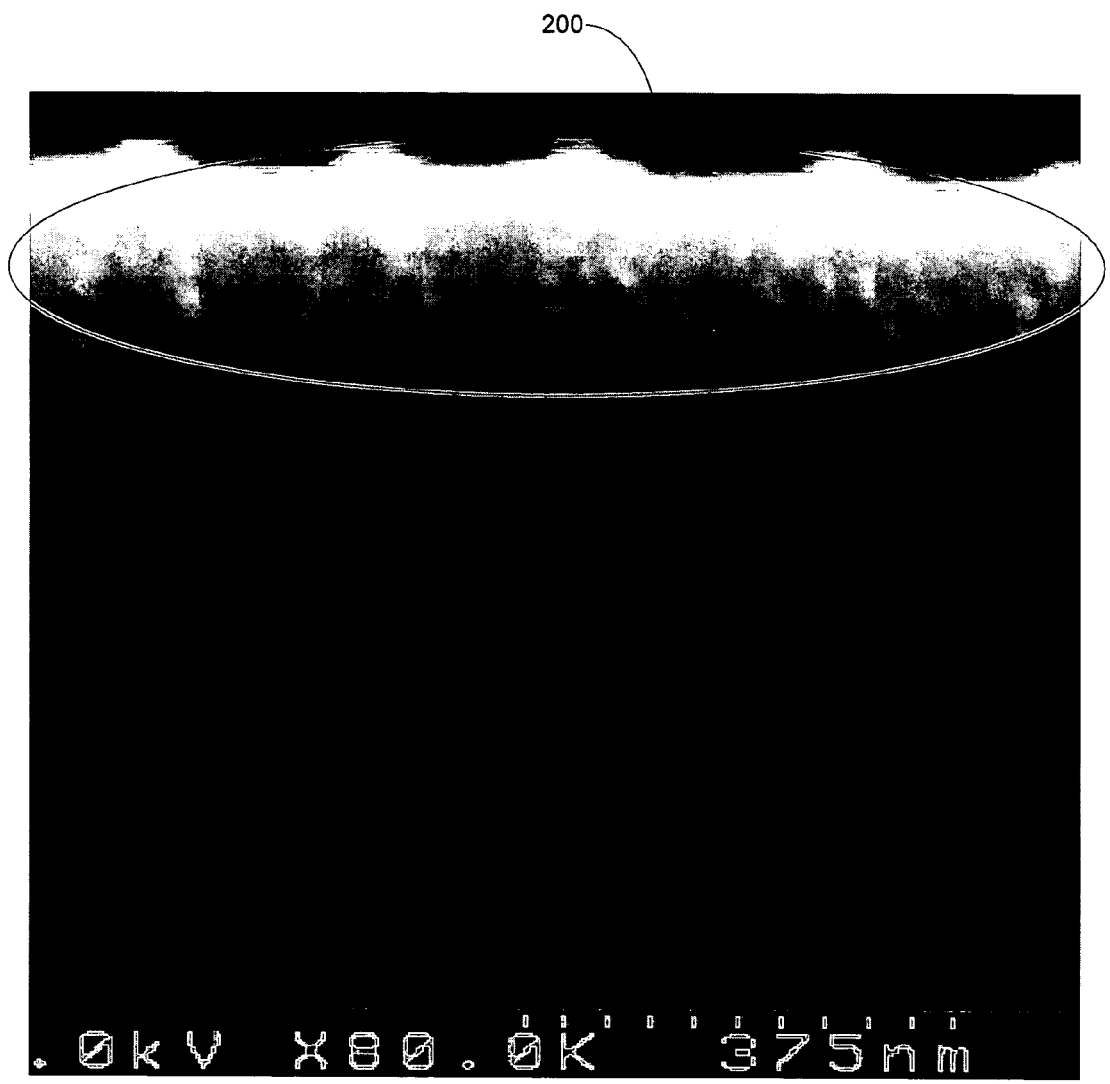
FIG. 2 is a micrograph of gaps filled with a high-hydrogen-flow HDP-CVD process that illustrates the formation of silicon-rich nodules.

The inventors discovered that one consequence of using high flow rates of $H_2$, at least relative to the flow rates of the oxygen source, was the development of silicon-rich nodules in the deposited film. This is illustrated in FIG. 2, which provides a micrograph of a deposition using flows of $SiH_4$, $O_2$, and $H_2$, with the $O_2$ flow being about 50 sccm and the $H_2$ flow being about 1000 sccm. In particular, the inventors have found significant development of silicon-rich nodules when the $H_2$ flow is more than 10 times the $O_2$ flow, and when the $O_2$ flow is less than 2.5 times the $SiH_4$ flow. As is evident in the marked area 200 in the form of small light-colored regions in the grayscale image, the use of such process parameters results in the formation of small nodular areas where the silicon concentration is undesirably high. A lack of composition uniformity in the deposited film may adversely affect device performance when completed devices are made using this process. For example, the composition nonuniformities may result in variation in refractive index over the film. In addition to being undesirable in applications where refractive-index consistency across the deposited film is desired, variations in refractive index may adversely affect chemical-mechanical polishing ("CMP") of the film. Such CMP processes typically make use of optical properties of the deposited film so that these types of imperfections in the film may adversely impact process control on subsequent CMP processes. While the specific investigations of the inventors were performed using high $H_2$ flows, the same adverse effect on film composition uniformity is anticipated in other processes that use high flows for the fluent gas in HDP-CVD deposition processes.

When the inventors recognized that the improved gapfill from a high hydrogen flow came at the cost of such an adverse impact on film composition uniformity, they set out to find a way of modifying the process to improve composition uniformity without mitigating the gapfill advantage provided by the high flow of fluent gas. One possibility that was believed would improve the composition uniformity was to increase the flow rate of the oxygen source relative to the flow rate of the silicon source. This proposal was rejected, however, because increasing the flow of the oxygen source would negatively impact the advantage provided by having a relatively high flow of $H_2$ to the oxygen source.

Thus, after considering how to address the issue, the inventors conceived that treatment of a partially deposited film to an oxygen plasma might arrest the development of silicon-rich nodules. They accordingly set out to perform a number of experiments in which a gap was partially filled using a high fluent-gas flow, followed by exposure to an oxygen plasma for a period of time, and then followed by completion of the gapfill process. The general structure of such an approach is illustrated with the flow diagram in FIG. 3A. After a substrate having a gap formed between adjacent raised surfaces is positioned within a substrate processing chamber, flows of silicon- and oxygen-containing gases are provided at block 304. These flows may be provided as $SiH_4$ and $O_2$ flows in one embodiment, although other precursors may be used in alternative embodiments. At block 308, a high flow of a fluent gas, such as $H_2$ or an $H_2$/He mixture, is also provided to the process chamber. A high-density plasma is formed from the process gas in the chamber at block 312 so that deposition of a silicon oxide film may proceed at block 316.

Exposure of the partially deposited layer to an oxygen plasma may conveniently be accomplished by terminating the flows of all other gases provided to the chamber, as indicated at block 320. Thus, for example, in an embodiment that uses $SiH_4$, $O_2$, and $H_2$ flows, termination of the $SiH_4$ and $H_2$ flows at block 320 without extinguishing the plasma results in a plasma in the process chamber that consists essentially of oxygen ions, which are then exposed to the partially filled layer. In other embodiments, the oxygen plasma treatment may be provided with processes that include such techniques as extinguishing the plasma, providing a different oxygen precursor than is used for the deposition phase, transferring the substrate to a different processing chamber, and the like. As indicated at block 324, the exposure of the partially deposited film acts to arrest the development of the silicon-rich nodules. Further deposition of the layer may then subsequently proceed. As indicated at block 328, this may conveniently be accomplished in some embodiments by re-initiating the flows of the silicon-containing and fluent gases to the process chamber. Thus, in such embodiments, the entire process of deposition/oxygen-plasma treatment/deposition may be performed without extinguishing the plasma.

Table 1 below sets forth typical process parameters that may be used for the deposition and oxygen-plasma treatment phases according to one embodiment of the invention. These process parameters are suitable for deposition using a chamber like the one described below and configured for processing of 300-mm diameter substrates.

TABLE I

Exemplary Process Parameters According to One Embodiment of the Invention

| Parameter | Deposition Phase | Oxygen-Treatment Phase |
|---|---|---|
| Top RF Power (W) | 7500–10,000 | 7500–10,000 |
| Side RF Power (W) | 5000–7500 | 7500–10,000 |
| Bias Power (W) | 5000–8000 | |
| Chamber Pressure (mtorr) | 5–50 | 5–50 |
| $SiH_4$ Flow (sccm) | 15–100 | |
| $O_2$ Flow (sccm) | 25–500 | 150–1000 |
| $H_2$ Flow (sccm) | 500–3000 | |
| Time (s) | 150–350 | >10 s |

In one specific embodiment, the deposition phase is performed with top and side RF powers of 9000 W, a bias power of 6900 W, a chamber pressure of 10 mtorr, a $SiH_4$ flow of 20 sccm, an $O_2$ flow of 45 sccm, and a $H_2$ flow of 1000 sccm. In one specific embodiment, the oxygen-treatment phase is performed with a top RF power of 9000 W, a side RF power of 6000 W, a chamber pressure of 15 mtorr, and on $O_2$ flow of 250 sccm. The inventors have found that a treatment time greater than 10 seconds for the oxygen-treatment is suitable, and may be 10-20 s. Exposure of the film to the oxygen-plasma treatment for a greater time appears to have little additional impact on the formation of silicon-rich nodules.

In some instances, it may be desirable to repeat the oxygen-plasma treatment multiple times at different stages during the film deposition. This is illustrated for some embodiments with the flow diagram of FIG. 3B. At block 334, a first portion of the silicon oxide film is deposited in a gap with an HDP-CVD process that has simultaneous deposition and sputtering components. Before the gap is completely filled, the deposited first portion of the film is treated at block 338 with exposure to a high-density oxygen plasma that consists substantially of oxygen ions. Such exposure acts to arrest the development of silicon-rich nodules forming up to that point in the process. Additional silicon oxide is deposited at block 342, again using an HDP-CVD process that has simultaneous deposition and sputtering components. Again before the gap is completely filled, the deposited second portion is treated at block 346 with a high-density oxygen plasma. Further silicon oxide is then deposited in the film at block 348, and the sequence of deposition/oxygen-plasma treatment/deposition may, in principle, be repeated as many times as necessary to fill the gap without significant formation of silicon-rich nodules.

Figures 3A, 3B:
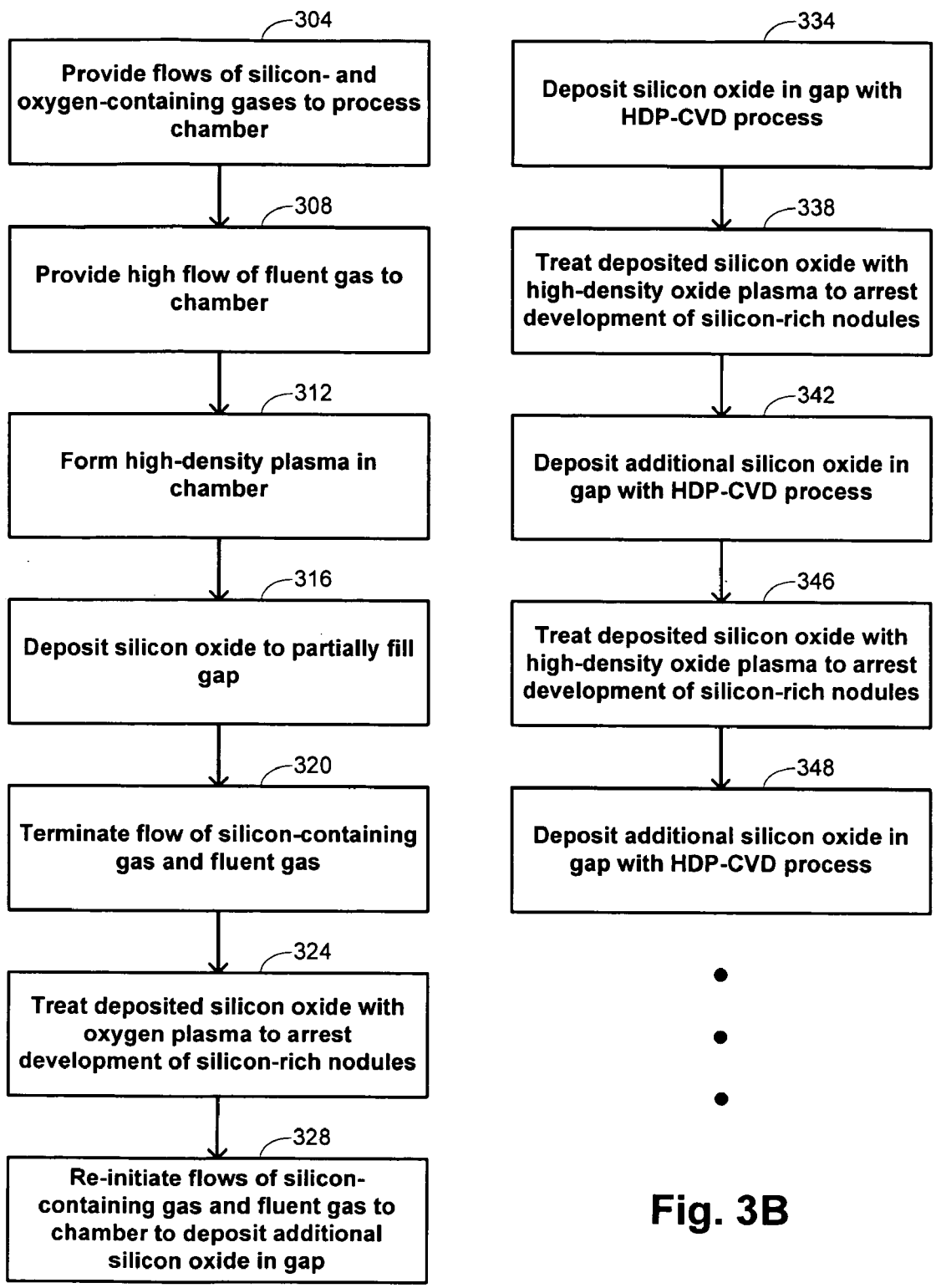
FIGS. 3A-3C are flow diagrams summarizing methods for depositing silicon oxide films according to certain embodiments of the invention.

Each of the deposition and oxygen-treatment phases shown in FIG. 3B may be performed with the process parameters discussed above. In some embodiments, the process advantageously uses an oxygen precursor that consists only of oxygen atoms, such as $O_2$, allowing the oxygen treatment to be initiated by terminating flows of other gases without extinguishing the plasma. In such instances, the subsequent deposition phases may be initiated by restarting the flows of the other gases at the conclusion of the oxygen-plasma treatment, again without extinguishing the plasma. It is not necessary for the plasma to be maintained, however, and in other embodiments the plasma may be extinguished between any or all of the deposition and oxygen-treatment phases.

While the invention is not restricted to any particular timing within the process when the oxygen treatments should be applied, the inventors have conducted experiments to identify certain suitable times for such applications. Generally, the process may be made more efficient if the oxygen treatment is not applied too soon, when it is not yet necessary, nor too late, when formation of silicon-rich nodules becomes impossible to avoid. In one set of embodiments, the inventors have found that two oxygen treatments may be made: a first of the oxygen treatments may be performed when about 15-35% of the original depth of the gap is filled, such as when the gap is greater than about 20% filled or about 25% filled; a second of the oxygen treatments may be performed when about 60-80% of the original depth of the gap is filled, such as when the gap is about 70% filled. In very aggressive gaps that warrant three or more oxygen treatments, the timing for application of the oxygen treatments may differ.

Figure 3C:
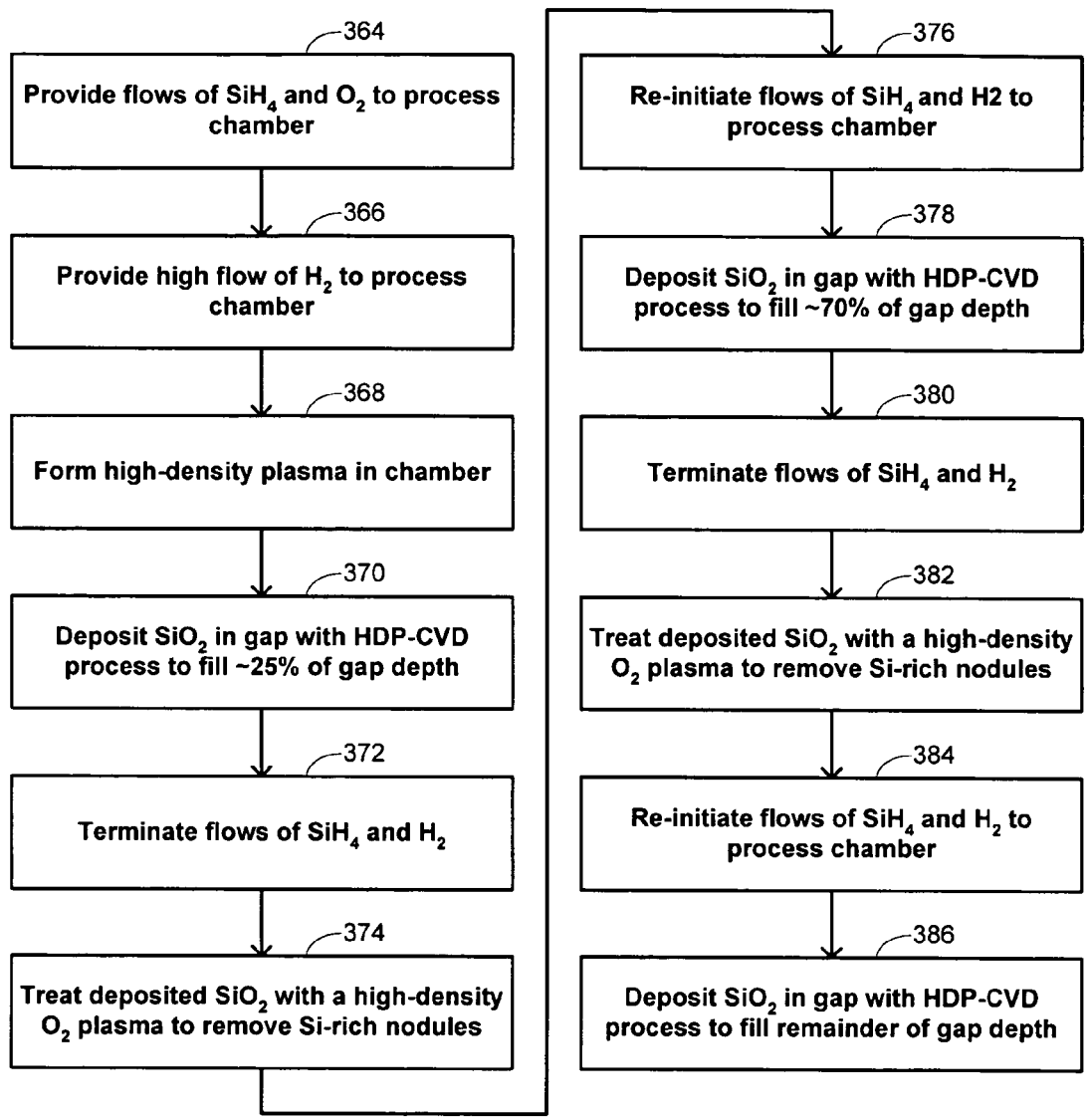

For purposes of illustration, FIG. 3C provides a more detailed flow diagram illustrating a specific embodiment that uses two such oxygen treatments for deposition of an undoped silicon oxide film. At block 364, flows of $SiH_4$ and $O_2$ are provided to a substrate process chamber. In some instances, the flow rate of the $O_2$ may be less than 2.5 times the flow rate of the $SiH_4$ to the process chamber. At block 366, a high flow of $H_2$ is provided to the process chamber. For example, flows of the $H_2$ may be more than 10 times the flow rate of the $O_2$ to the process chamber. A high-density plasma is formed in the chamber at block 368 so that $SiO_2$ is deposited over the substrate and in the gap at block 370. When about 25% of the original depth of the gap is filled, the flows of $SiH_4$ and $H_2$ are terminated at block 372 without extinguishing the plasma. The flow rate of the $O_2$ may be adjusted when treating the deposited $SiO_2$ with the resulting high-density oxygen plasma at block 374, the treatment arresting the development of silicon-rich nodules as described above.

At block 376, the flows of $SiH_4$ and $H_2$ are re-initiated, and perhaps the flow rate of the $O_2$ is adjusted, so that another deposition phase is entered. More $SiO_2$ is deposited in the gap at block 378 until about 70% of an original depth of the gap is filled. At that point, the flows of $SiH_4$ and $H_2$ are again terminated at block 380 without extinguishing the plasma, so that additional deposited $SiO_2$ is exposed to an oxygen plasma to arrest development of silicon-rich nodules in the second portion of the film. Again, the flow rate of the $O_2$ to the process chamber may be adjusted for the oxygen-treatment phase. At block 384, the flows of $SiH_4$ and $H_2$ are again re-initiated, perhaps also with an adjustment of the $O_2$ flow rate so that additional material is deposited over the substrate and into the gap at block 386. This deposition phase of the process is continued until the gap is completely filled.

Figure 4:
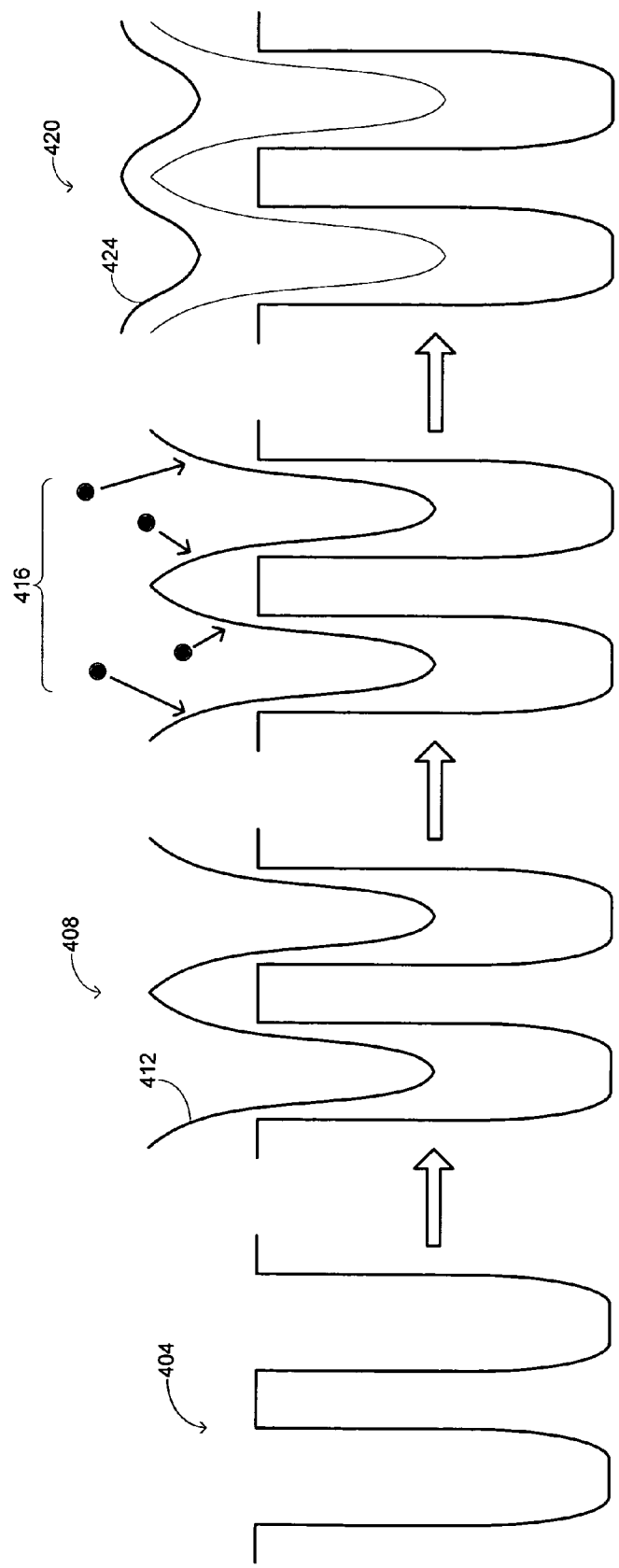
FIG. 4 is a schematic illustration of how the formation of silicon-rich nodules is mitigated in embodiments of the invention that use a high hydrogen flow.

An illustration of the technique is shown schematically with the sequence of drawings in FIG. 4. This sequence is shown for an embodiment that uses only one oxygen-plasma treatment. The initial gaps in a substrate structure 404 are evident in the left-most drawing of the figure. After deposition of the first portion 412 of the silicon oxide layer, the intermediate structure 408 shown in the second drawing from the left of FIG. 4 results. During the oxygen-plasma treatment, oxygen ions 416 are provided to forming silicon-rich nodules where they react to produce silicon oxide that becomes part of the film. The result 420 of the subsequent deposition of a second portion 424 of the silicon oxide layer is shown in the right-most drawing of the figure.

Figure 5:
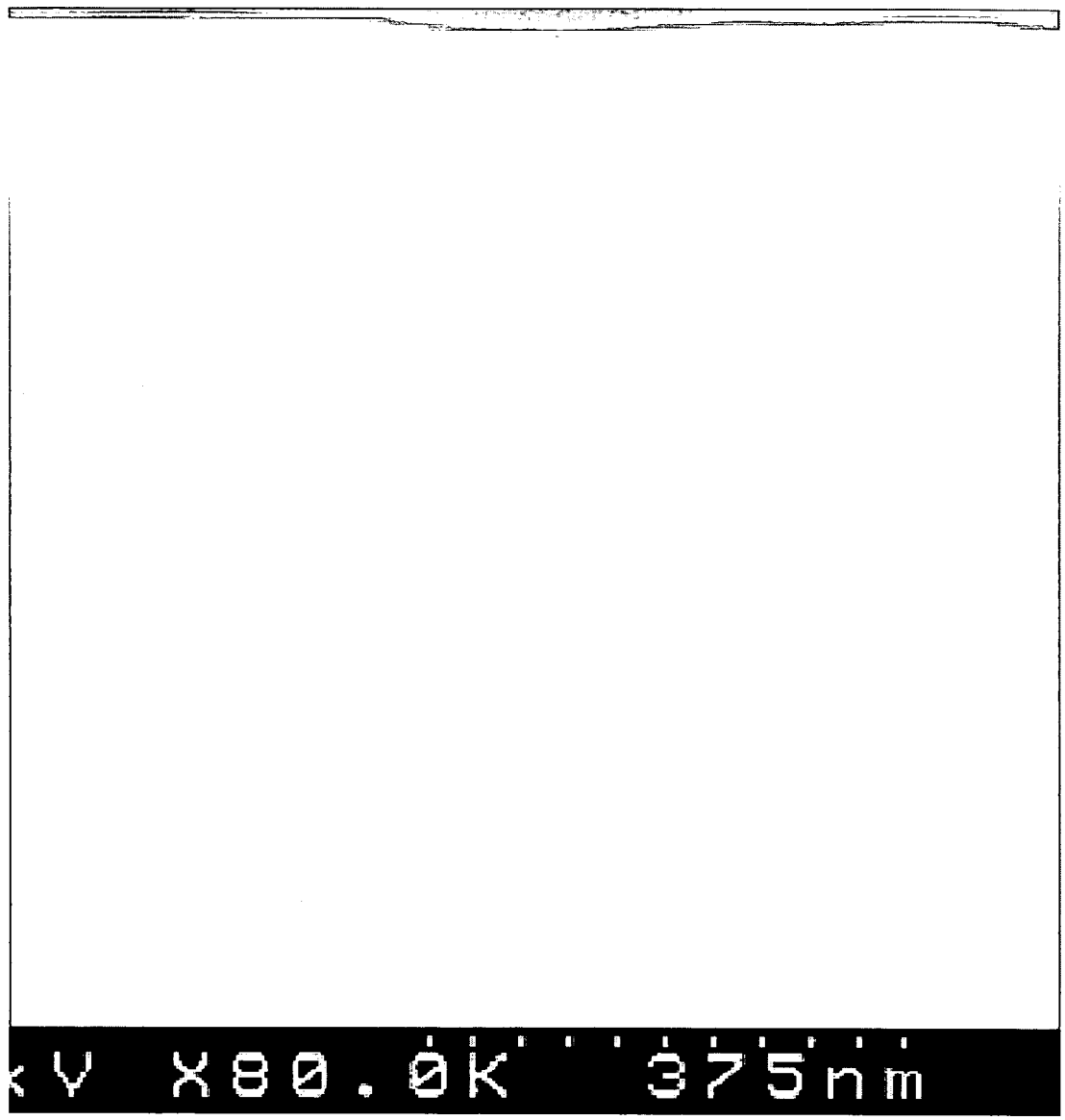
FIG. 5 is a micrograph of gaps filled with certain method embodiments that mitigate the formation of silicon-rich nodules.

To illustrate the effect of the described processes, a micrograph is provided in FIG. 5 showing a layer deposited as described. Comparison of FIG. 5 with FIG. 2, which shows results without the oxygen-plasma treatment, demonstrate that there is a substantial mitigation in the formation of silicon-rich nodules in the silicon oxide film.

Exemplary Substrate Processing System

Figure 6A:
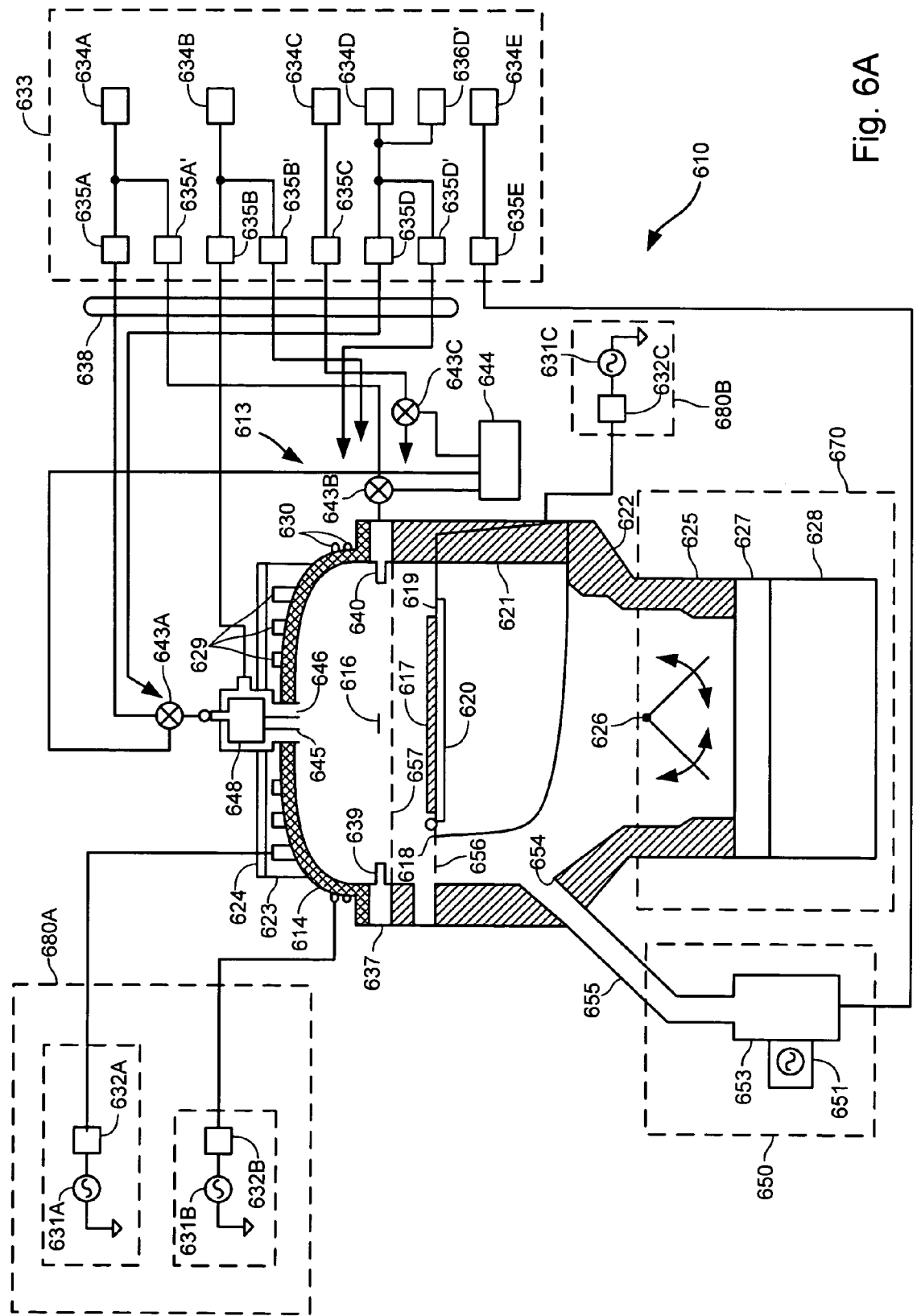
FIG. 6A is a simplified diagram of one embodiment of an HDP-CVD system according to the present invention.
Figure 6B:
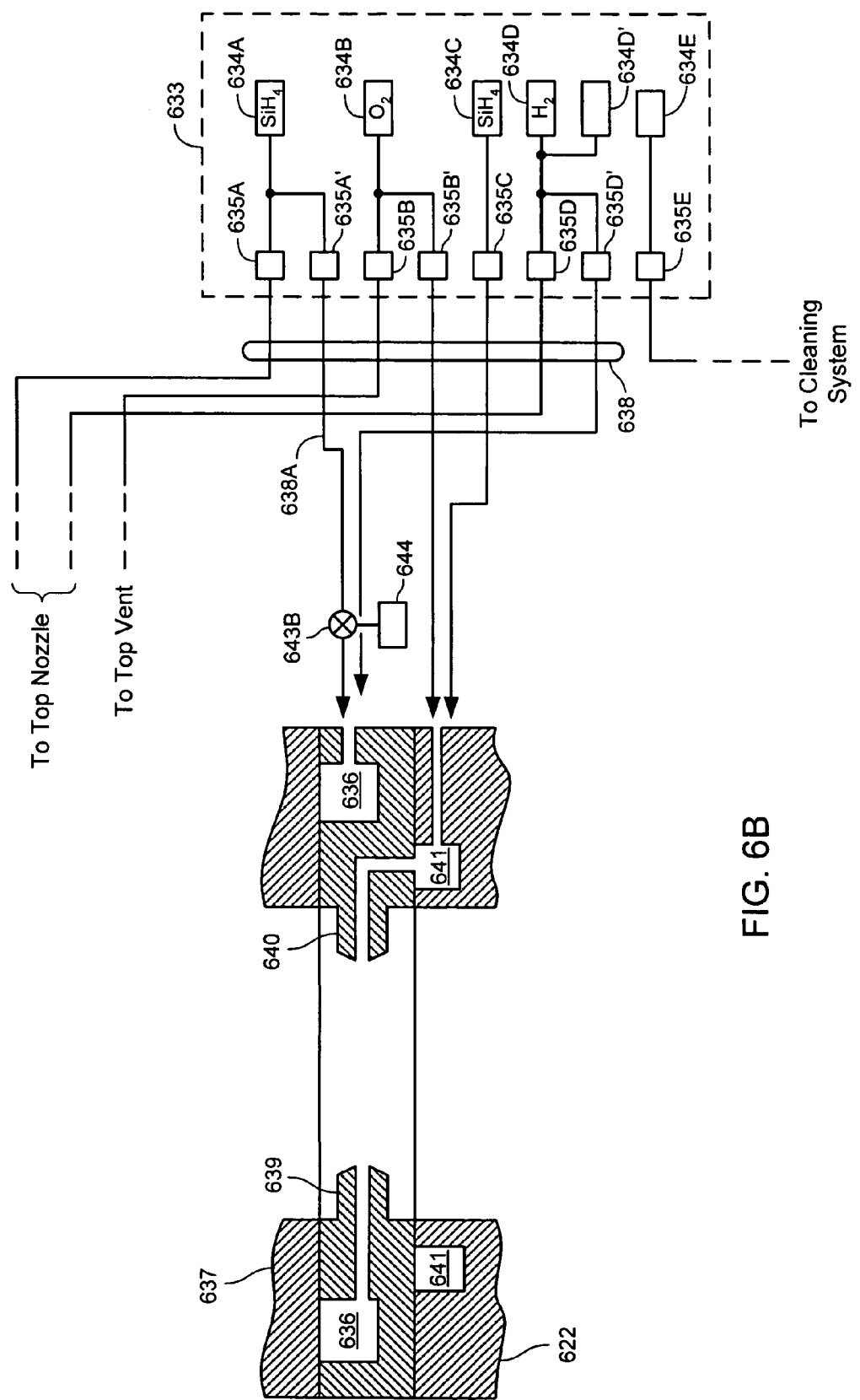
FIG. 6B is a simplified cross section of a gas ring that may be used in conjunction with the exemplary HDP-CVD processing chamber of FIG. 5A.

The methods described above may be implemented with a variety of HDP-CVD systems, some of which are described in detail in connection with FIGS. 6A-6C. FIG. 6A schematically illustrates the structure of such an HDP-CVD system 610 in one embodiment. The system 610 includes a chamber 613, a vacuum system 670, a source plasma system 680A, a bias plasma system 680B, a gas delivery system 633, and a remote plasma cleaning system 650.

The upper portion of chamber 613 includes a dome 614, which is made of a ceramic dielectric material, such as aluminum oxide or aluminum nitride. Dome 614 defines an upper boundary of a plasma processing region 616. Plasma processing region 616 is bounded on the bottom by the upper surface of a substrate 617 and a substrate support member 618.

A heater plate 623 and a cold plate 624 surmount, and are thermally coupled to, dome 614. Heater plate 623 and cold plate 624 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 613 includes a body member 622, which joins the chamber to the vacuum system. A base portion 621 of substrate support member 618 is mounted on, and forms a continuous inner surface with, body member 622. Substrates are transferred into and out of chamber 613 by a robot blade (not shown) through an insertion/removal opening (not shown) in the side of chamber 613. Lift pins (not shown) are raised and then lowered under the control of a motor (also not shown) to move the substrate from the robot blade at an upper loading position 657 to a lower processing position 656 in which the substrate is placed on a substrate receiving portion 619 of substrate support member 618. Substrate receiving portion 619 includes an electrostatic chuck 620 that secures the substrate to substrate support member 618 during substrate processing. In a preferred embodiment, substrate support member 618 is made from an aluminum oxide or aluminum ceramic material.

Vacuum system 670 includes throttle body 625, which houses twin-blade throttle valve 626 and is attached to gate valve 627 and turbo-molecular pump 628. It should be noted that throttle body 625 offers minimum obstruction to gas flow, and allows symmetric pumping. Gate valve 627 can isolate pump 628 from throttle body 625, and can also control chamber pressure by restricting the exhaust flow capacity when throttle valve 626 is fully open. The arrangement of the throttle valve, gate valve, and turbo-molecular pump allow accurate and stable control of chamber pressures from between about 1 millitorr to about 2 torr.

The source plasma system 680A includes a top coil 629 and side coil 630, mounted on dome 614. A symmetrical ground shield (not shown) reduces electrical coupling between the coils. Top coil 629 is powered by top source RF (SRF) generator 631A, whereas side coil 630 is powered by side SRF generator 631B, allowing independent power levels and frequencies of operation for each coil. This dual coil system allows control of the radial ion density in chamber 613, thereby improving plasma uniformity. Side coil 630 and top coil 629 are typically inductively driven, which does not require a complimentary electrode. In a specific embodiment, the top source RF generator 631A provides up to 2,500 watts of RF power at nominally 2 MHz and the side source RF generator 631B provides up to 5,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 680B includes a bias RF ("BRF") generator 631C and a bias matching network 632C. The bias plasma system 680B capacitively couples substrate portion 617 to body member 622, which act as complimentary electrodes. The bias plasma system 680B serves to enhance the transport of plasma species (e.g., ions) created by the source plasma system 680A to the surface of the substrate. In a specific embodiment, bias RF generator provides up to 5,000 watts of RF power at 13.56 MHz.

RF generators 631A and 631B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 632A and 632B match the output impedance of generators 631A and 631B with their respective coils 629 and 630. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

A gas delivery system 633 provides gases from several sources, 634A-634E chamber for processing the substrate via gas delivery lines 638 (only some of which are shown). As would be understood by a person of skill in the art, the actual sources used for sources 634A-634E and the actual connection of delivery lines 638 to chamber 613 varies depending on the deposition and cleaning processes executed within chamber 613. Gases are introduced into chamber 613 through a gas ring 637 and/or a top nozzle 645. FIG. 6B is a simplified, partial cross-sectional view of chamber 613 showing additional details of gas ring 637.

In one embodiment, first and second gas sources, 634A and 634B, and first and second gas flow controllers, 635A' and 635B', provide gas to ring plenum 636 in gas ring 637 via gas delivery lines 638 (only some of which are shown). Gas ring 637 has a plurality of source gas nozzles 639 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 637 has 12 source gas nozzles made from an aluminum oxide ceramic.

Gas ring 637 also has a plurality of oxidizer gas nozzles 640 (only one of which is shown), which in a preferred embodiment are co-planar with and shorter than source gas nozzles 639, and in one embodiment receive gas from body plenum 641. In some embodiments it is desirable not to mix source gases and oxidizer gases before injecting the gases into chamber 613. In other embodiments, oxidizer gas and source gas may be mixed prior to injecting the gases into chamber 613 by providing apertures (not shown) between body plenum 641 and gas ring plenum 636. In one embodiment, third, fourth, and fifth gas sources, 634C, 634D, and 634D', and third and fourth gas flow controllers, 635C and 635D', provide gas to body plenum via gas delivery lines 638. Additional valves, such as 643B (other valves not shown), may shut off gas from the flow controllers to the chamber. In implementing certain embodiments of the invention, source 634A comprises a silane $SiH_4$ source, source 634B comprises a molecular oxygen $O_2$ source, source 634C comprises a silane $SiH_4$ source, source 634D comprises a helium He source, and source 634D' comprises a molecular hydrogen $H_2$ source.

In embodiments where flammable, toxic, or corrosive gases are used, it may be desirable to eliminate gas remaining in the gas delivery lines after a deposition. This may be accomplished using a 3-way valve, such as valve 643B, to isolate chamber 613 from delivery line 638A and to vent delivery line 638A to vacuum foreline 644, for example. As shown in FIG. 6A, other similar valves, such as 643A and 643C, may be incorporated on other gas delivery lines. Such three-way valves may be placed as close to chamber 613 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 6A, chamber 613 also has top nozzle 645 and top vent 646. Top nozzle 645 and top vent 646 allow independent control of top and side flows of the gases, which improves film uniformity and allows fine adjustment of the film's deposition and doping parameters. Top vent 646 is an annular opening around top nozzle 645. In one embodiment, first gas source 634A supplies source gas nozzles 639 and top nozzle 645. Source nozzle MFC 635A' controls the amount of gas delivered to source gas nozzles 639 and top nozzle MFC 635A controls the amount of gas delivered to top gas nozzle 645. Similarly, two MFCs 635B and 635B' may be used to control the flow of oxygen to both top vent 646 and oxidizer gas nozzles 640 from a single source of oxygen, such as source 634B. The gases supplied to top nozzle 645 and top vent 646 may be kept separate prior to flowing the gases into chamber 613, or the gases may be mixed in top plenum 648 before they flow into chamber 613. Separate sources of the same gas may be used to supply various portions of the chamber.

A remote microwave-generated plasma cleaning system 650 is provided to periodically clean deposition residues from chamber components. The cleaning system includes a remote microwave generator 651 that creates a plasma from a cleaning gas source 634E (e.g., molecular fluorine, nitrogen trifluoride, other fluorocarbons or equivalents) in reactor cavity 653. The reactive species resulting from this plasma are conveyed to chamber 613 through cleaning gas feed port 654 via applicator tube 655. The materials used to contain the cleaning plasma (e.g., cavity 653 and applicator tube 655) must be resistant to attack by the plasma. The distance between reactor cavity 653 and feed port 654 should be kept as short as practical, since the concentration of desirable plasma species may decline with distance from reactor cavity 653. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 620, do not need to be covered with a dummy wafer or otherwise protected, as may be required with an in situ plasma cleaning process.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in commonly assigned U.S. Pat. No. 6,170,428, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

Those of ordinary skill in the art will realize that processing parameters can vary for different processing chambers and different processing conditions, and that different precursors can be used without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method of depositing a silicon oxide film on a substrate disposed in a substrate processing chamber, the substrate having a gap formed between adjacent raised surfaces, the method comprising:

flowing a process gas comprising a silicon-containing gas, an oxygen-containing gas, and a fluent gas into the substrate processing chamber, wherein:
the fluent gas is introduced into the substrate processing chamber at a fluent-gas flow rate of at least 500 sccm;
the fluent-gas flow rate is more than ten times an oxygen-containing-gas flow rate of the oxygen-containing gas; and
the oxygen-containing-gas flow rate is less than 2.5 times a silicon-containing-gas flow rate of the silicon-containing gas;
forming a plasma having an ion density of at least $10^{11}$ ions/cm$^3$ from the process gas to deposit a first portion of the silicon oxide film over the substrate and into the gap;
thereafter, exposing the deposited first portion to a plasma having at least $10^{11}$ ions/cm$^3$ and consisting essentially of oxygen ions; and
thereafter, depositing a second portion of the silicon oxide film over the substrate and into the gap,
wherein the step of exposing the deposited first portion to a plasma consisting essentially of oxygen ions is performed at a time that avoids formation of silicon-rich nodules in the deposited silicon oxide film.

2. The method recited in claim 1 wherein exposing the deposited first portion is performed for at least 10 seconds.

3. The method recited in claim 1 wherein further comprising:
exposing the deposited second portion to a plasma having at least $10^{11}$ ions/cm$^3$ and consisting essentially of oxygen ions; and
thereafter, depositing a third portion of the silicon oxide film over the substrate and into the gap.

4. The method recited in claim 3 wherein exposing the deposited first portion is performed when more than 20% of an original height of the gap is filled.

5. The method recited in claim 4 wherein exposing the deposited second portion is performed when more than 60% of the original height of the gap is filled.

6. The method recited in claim 1 wherein the fluent gas comprises H$_2$.

7. The method recited in claim 6 wherein the flow rate of the H$_2$ is at least 800 sccm.

8. The method recited in claim 1 wherein exposing the deposited first portion comprises terminating a flow of the silicon-containing gas and a flow of the fluent gas without extinguishing the plasma.

9. The method recited in claim 8 wherein depositing the second portion comprises restarting the flow of the silicon-containing gas and the flow of the fluent gas without extinguishing the plasma.

10. A method of depositing a silicon oxide film on a substrate disposed in a substrate processing chamber, the substrate having a gap formed between adjacent raised surfaces, the method comprising:
depositing a first portion of the silicon oxide film over the substrate and within the gap by forming a first high-density plasma that provides simultaneous deposition and sputtering components from a first process gas comprising a silicon source, an oxygen source, and a fluent gas;
thereafter, exposing the deposited first portion to a plasma consisting essentially of oxygen ions;
thereafter, depositing a second portion of the silicon oxide film over the substrate and within the gap by forming a high-density plasma that provides simultaneous deposition and sputtering components from a second process gas comprising a silicon source, an oxygen source, and a fluent gas;
thereafter, exposing the deposited second portion to a plasma consisting essentially of oxygen atoms; and
thereafter, depositing a third portion of the silicon oxide film over the substrate and into the gap,
wherein:
depositing the first portion and depositing the second portion each comprise:
flowing the fluent gas into the substrate processing chamber at a fluent-gas flow rate of at least 500 sccm;
flowing the oxygen source into the substrate processing chamber at an oxygen-source flow rate, wherein the fluent-gas flow rate is more than ten times the oxygen-source flow rate; and
flowing the silicon source into the substrate processing chamber at a silicon-source flow rate, wherein the oxygen-source flow rate is less than 2.5 times the silicon-source flow rate; and
the steps of exposing the deposited first portion to a plasma consisting essentially oxygen atoms and exposing the deposited second portion to a plasma consisting essentially of oxygen atoms are each performed at a time that avoids formation of silicon-rich nodules in the deposited silicon oxide film.

11. The method recited in claim 10 wherein exposing the deposited first portion is performed when more than 20% of an original height of the gap is filled.

12. The method recited in claim 10 wherein exposing the deposited second portion is performed when more than 60% of the original height of the gap is filled.

13. The method recited in claim 10 wherein the fluent gas comprises H$_2$ and the flow rate of the H$_2$ is at least 800 sccm.

14. The method recited in claim 10 wherein exposing the deposited first portion, depositing the second portion, exposing the deposited second portion, and depositing the third portion are performed without extinguishing the plasma.

15. A method of depositing a silicon oxide film on a substrate disposed in a substrate processing chamber, the substrate having a gap formed between adjacent raised surfaces, the method comprising:
depositing a first portion of the silicon oxide film over the substrate and within the gap by forming a high-density plasma that provides simultaneous deposition and sputtering components from a first process gas comprising SiH$_4$, O$_2$, and H$_2$ in the substrate processing chamber, wherein the H$_2$ is introduced into the substrate processing chamber with a flow rate at least ten times greater than a flow rate of the O$_2$ and the flow rate of the O$_2$ is less than 2.5 times a flow rate of the SiH$_4$;
thereafter, exposing the deposited first portion to a high-density plasma consisting essentially of oxygen ions for at least 10 seconds; and
thereafter, depositing a second portion of the silicon oxide film over the substrate and into the gap,
wherein the step of exposing the deposited first portion to a high-density plasma consisting essentially of oxygen ions is performed at a time that avoids formation of silicon-rich nodules in the deposited silicon oxide film.

16. The method recited in claim 15 wherein exposing the first deposited portion comprises terminating a flow of the $SiH_4$ and the $H_2$ to the substrate processing chamber without extinguishing the plasma.

17. The method recited in claim 16 wherein depositing the second portion of the silicon oxide film comprises forming a high-density plasma that provides simultaneous deposition and sputtering components from a second process gas comprising $SiH_4$, $O_2$, and $H_2$ in the substrate processing chamber, wherein the $H_2$ is introduced into the substrate processing chamber with a flow rate at least ten times greater than a flow rate of the $O_2$.

18. The method recited in claim 17 wherein depositing the second portion of the silicon oxide film comprises restarting the flow of the $SiH_4$ and the $H_2$.

19. The method recited in claim 16 further comprising:
   exposing the deposited second portion to a high-density plasma consisting essentially of oxygen ions for at least 10 seconds; and
   thereafter, depositing a third portion of the silicon oxide film over the substrate and into the gap.

20. A method of depositing a silicon oxide film on a substrate disposed in a substrate processing chamber, the substrate having a gap formed between adjacent raised surfaces, the method comprising:
   flowing a first process gas comprising a silicon-containing gas, an oxygen-containing gas, and molecular-hydrogen gas into the substrate processing chamber, wherein:
      the molecular-hydrogen gas is introduced into the substrate processing chamber at a molecular-hydrogen flow rate of at least 500 sccm;
      the oxygen-containing gas is introduced into the substrate processing chamber at an oxygen-containing-gas flow rate, the molecular-hydrogen flow rate being at least ten times the oxygen-containing-gas flow rate; and
      the silicon-containing gas is introduced into the substrate processing chamber at a silicon-containing-gas flow rate, the oxygen-containing-gas flow rate being less than 2.5 times the silicon-containing-gas flow rate;
   forming a plasma having an ion density of at least $10^{11}$ ions/cm$^3$ from the first process gas to deposit a first portion of the silicon oxide film over the substrate and into the gap with a high-density plasma process that has simultaneous deposition and etching components;
   thereafter, when approximately 15%-35% of an original height of the gap is filled, flowing a first treatment gas consisting essentially of an oxygen-containing gas into the process chamber;
   exposing the deposited first portion to a plasma having an ion density of at least $10^{11}$ ions/cm$^3$ formed from the first treatment gas for at least 10 seconds;
   thereafter, flowing a second process gas comprising a silicon-containing gas, an oxygen-containing gas, and molecular-hydrogen gas into the substrate processing chamber, wherein:
      the molecular-hydrogen gas is introduced into the substrate processing chamber at a molecular-hydrogen flow rate of at least 500 sccm;
      the oxygen-containing gas is introduced into the substrate processing chamber at an oxygen-containing-gas flow rate, the molecular-hydrogen flow rate being at least ten times the oxygen-containing-gas flow rate; and
      the silicon-containing gas is introduced into the substrate processing chamber at a silicon-containing-gas flow rate, the oxygen-containing-gas flow rate being less than 2.5 times the silicon-containing-gas flow rate;
   forming a plasma having an ion density of at least $10^{11}$ ions/cm$^3$ from the second process gas to deposit a second portion of the silicon oxide film over the substrate and into the gap with a high-density plasma process that has simultaneous deposition and etching components;
   thereafter, when approximately 60%-80% of the original height of the gap is filled, flowing a second treatment gas consisting essentially of an oxygen-containing gas into the process chamber;
   exposing the deposited second portion to a plasma having an ion density of at least $10^{11}$ ions/cm$^3$ formed from the second treatment gas for at least 10 seconds; and
   thereafter, depositing a third portion of the silicon oxide film over the substrate and into the gap,
   wherein the steps of exposing the deposited first portion to a plasma formed from the first treatment gas and exposing the deposited second portion to a plasma formed from the second treatment gas are each performed at a time that avoids formation of silicon-rich nodules in the deposited silicon oxide film.

* * * * *